United States Patent [19]

Shreeve et al.

[11] Patent Number: 5,046,953
[45] Date of Patent: Sep. 10, 1991

[54] METHOD AND APPARATUS FOR MOUNTING AN INTEGRATED CIRCUIT ON A PRINTED CIRCUIT BOARD

[75] Inventors: Robert W. Shreeve, Corvallis, Oreg.; Michael D. Dobbs; Lucy E. Burris, both of Vancouver, Wash.; Robert B. Freund, Owego, N.Y.; Ronald W. Keil, Corvallis, Oreg.

[73] Assignee: Hewlett-Packard Company, Palo Alto, Calif.

[21] Appl. No.: 529,069

[22] Filed: May 25, 1990

[51] Int. Cl.⁵ .................. H01R 9/09; H05K 3/34
[52] U.S. Cl. .................. 439/66; 29/840; 174/260; 228/180.2; 439/68; 439/331
[58] Field of Search .............. 439/68, 331, 395, 66; 228/180.2; 174/260; 361/400, 401; 357/80; 29/840

[56] References Cited

U.S. PATENT DOCUMENTS

| | | | |
|---|---|---|---|
| 3,541,222 | 11/1970 | Parks et al. | 174/260 |
| 3,983,458 | 9/1976 | Jordan et al. | 361/401 |
| 4,095,867 | 6/1978 | Parks . | |
| 4,144,648 | 3/1979 | Grovender | 439/345 X |
| 4,371,912 | 1/1983 | Guzik | 228/180.2 X |
| 4,381,131 | 4/1983 | Demnianiuk | 357/80 X |
| 4,390,220 | 6/1983 | Benasutti | 439/331 X |
| 4,395,084 | 7/1983 | Conrad | 439/331 |
| 4,423,435 | 12/1983 | Test . | |
| 4,553,192 | 11/1985 | Babuka et al. . | |
| 4,614,387 | 9/1986 | Hartl . | |
| 4,716,049 | 12/1987 | Patraw . | |
| 4,736,277 | 4/1988 | Brown . | |

OTHER PUBLICATIONS

Raychem Development Product: A Universal IC Connector (and description of same) (1 page).

Primary Examiner—Carl J. Arbes

[57] ABSTRACT

Method and apparatus for creating an electrical connection between a tape-assisted bonding (TAB) segment having a plurality of conductive leads formed thereon and a printed circuit board also having a plurality of conductive leads formed thereon. A sheet of polymeric material having conductive elements mounted thereon so that each element protrudes from both sides of the sheet is disposed between a plurality of TAB segment leads and a corresponding plurality of generally opposing printed circuit board leads. A clamp secures the TAB segment to the printed circuit board thereby sandwiching the conductive elements between the TAB segment leads and the printed circuit board leads thus creating electrical connections between the opposing leads.

25 Claims, 3 Drawing Sheets

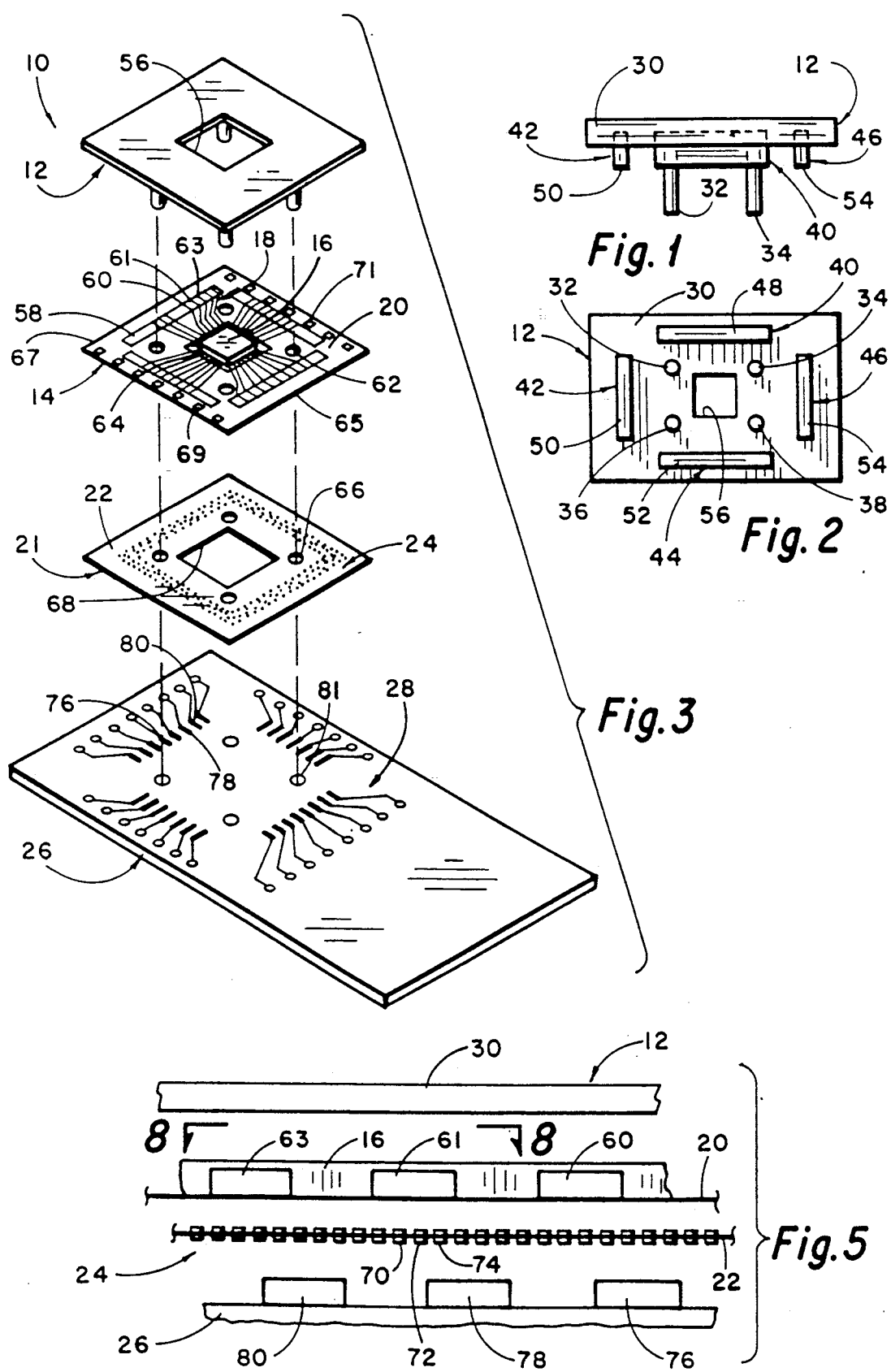

METHOD AND APPARATUS FOR MOUNTING AN INTEGRATED CIRCUIT ON A PRINTED CIRCUIT BOARD

BACKGROUND OF THE INVENTION

1. Field of the Invention

The present invention relates to methods and apparatus for mounting integrated circuits on a printed circuit (PC) board and more particularly to such methods and apparatus which achieve electrical connection between the integrated circuit and the PC board without soldering.

2. Description of the Related Art

Tape assisted bonding (TAB) is a technique for connecting conductive leads to the electrical contacts on an integrated circuit chip, known as a die. When such leads are so connected, they can be used to interconnect the integrated circuit with additional circuitry. Typically a strip of film is divided into a plurality of adjacent rectangular segments, each of which has a plurality of conductive leads etched thereon. A die mounted on a central portion of each segment is electrically connected to the conductive leads in a known manner. When so assembled, the film or tape upon which the die are mounted may be wound onto reels prior to additional processing, testing and the like. After final testing, the tape is cut into individual TAB segments, each of which contains a die and an associated set of conductive leads.

Sometimes, such TAB segments are mounted on PC boards. The PC boards include a plurality of conductive leads, sometimes referred to as traces or conductive metallization, with which corresponding TAB segment leads are first aligned and then electrically and mechanically connected via soldering. Mounting TAB segments on PC boards with soldered connections is disadvantageous for several reasons.

First, because of the possibility of solder bridging between adjacent leads, the leads on the TAB segment must be precisely aligned opposite the corresponding PC board leads to prevent solder bridging between a TAB lead and an adjacent PC board lead. Such alignment requires expensive equipment which utilizes video techniques as opposed to much cheaper alignment systems which utilize optical reflectance methods. In addition to the capital cost of the alignment system, there is additional expense associated with specialized soldering equipment adapted to solder TAB segment leads to PC board leads and the cleaning equipment which is utilized after soldering. Waste disposal of substances such as fluorocarbons, fluxes and lead also presents additional operational expenses when soldering is used.

The heat associated with the soldering process is also disadvantageous in several respects. It is undesirable to expose the integrated circuits on the TAB segments to the heat necessary for melting the solder to make the connection. Some circuits are more sensitive than others and circuit reliability may be affected by the heat. Because TAB soldering techniques are often different from those required to solder other components to a PC board, either the TAB segments are soldered first and thereafter the other components, or vice versa. In either case, the solder connections which are first made may be weakened or become completely disconnected when heat is applied to make the second solder connections.

The field replacement of TAB segments which are soldered to PC boards is difficult, and in some cases impossible, because of the close lead spacing and the alignment tolerances. Such replacement for systems in the field is desirable to make repairs, to enhance performance or to add a capability to the system in which the PC board is installed.

Finally, the assembly cycle time required for soldering a typical TAB segment to a PC board is about 5 minutes. It would be advantageous to reduce this time considerably.

SUMMARY OF THE INVENTION

The invention comprises a method for creating an electrical connection between a TAB segment having a plurality of conductive leads formed thereon and a printed circuit board also having a plurality of conductive leads formed thereon. A plurality of conductive elements are disposed between a selected TAB segment lead and a selected PC board lead. The TAB segment and the circuit board are positioned so that the selected leads are generally opposite one another. Thereafter the TAB segment is urged toward the circuit board thereby compressing the conductive elements between the selected leads. In another aspect of the invention, dimples are formed on the TAB segment leads which are urged against corresponding opposing circuit board leads thereby creating an electrical connection therebetween.

Apparatus used in connection with implementing the method is also provided.

It is a general object of the present invention to provide a method and apparatus for mounting a TAB segment on a PC board which overcomes the above-enumerated disadvantages associated with the prior art.

It is another object of the present invention to provide such a method and apparatus which reduces both the capital costs for the equipment required to make the connections as well as the operating costs associated with the process of connecting the TAB segment to the PC board.

It is a more specific object of the invention to provide such a method and apparatus which eliminates problems associated with the heating necessary to implement the soldering process for making such connections.

It is another specific object of the present invention to provide such a method and apparatus which is usable to replace a TAB segment in the field.

It is still another more specific object of the present invention to provide such a method and apparatus which requires a relatively short time to make and to undo the connections between a TAB segment and a PC board.

The foregoing and other objects, features and advantages of the invention will become more readily apparent from the following detailed description of a preferred embodiment which proceeds with reference to the drawings.

BRIEF DESCRIPTION OF THE DRAWINGS

FIG. 1 is a side view of a clamp constructed in accordance with the present invention.

FIG. 2 is a bottom plan view of the clamp shown in FIG. 1.

FIG. 3 is an exploded perspective view of structure constructed in accordance with the present invention.

FIG. 5 is an enlarged view taken along lines 5—5 in FIG. 4.

BRIEF DESCRIPTION OF THE PREFERRED EMBODIMENTS

Figure 4:
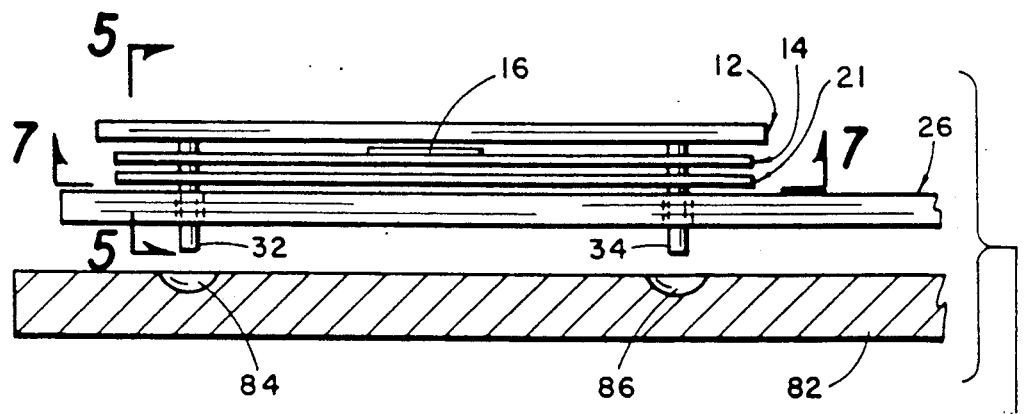
FIG. 4 is a side elevational view of the exploded structure illustrated in FIG. 3 incorporating a slightly different clamp and further including a heat staking iron.

Turning first to FIG. 3, indicated generally at 10 is apparatus constructed in accordance with the present invention. Included therein is a clamp 12 and a tape-assisted bonding (TAB) segment 14. Clamp 12 is also referred to herein as compressing or urging means. The TAB segment includes an integrated circuit chip or die 16 and a plurality of conductive leads, indicated generally at 18, which extend from each side of the die and which make electrical connections with the circuit formed in the die. Leads 18 are formed on a film segment 20 utilizing a conventional process. Likewise, the method for connecting leads 18 to their associated electrical contacts on the die is known.

A z-axis conductor, indicated generally at 21, includes a film or sheet 22 of nonconductive material. In the present embodiment, sheet 22 is formed from flexible, transparent polymeric material, namely a polyimide material in the preferred embodiment. The sheet includes a plurality of conductive elements, indicated generally at 24, mounted thereon so that each element protrudes from both sides of sheet 22. The term "z-axis" refers to conduction in the vertical direction, as viewed in FIG. 3, rather than in the horizontal direction.

A printed circuit (PC) board 26 includes a plurality of conductive leads 28 formed on the board using a conventional process. Although a printed circuit board is shown herein and referred to in the claims, it should be appreciated that any electrical substrate, such as hybrid substrates, molded circuits, flexible circuits, etc., can be utilized in practicing the present invention.

A brief general description of the manner in which the preferred embodiment illustrated in FIG. 3 functions to connect leads 18 on TAB segment 14 to leads 28 on PC board 26 follows. First, clamp 12, TAB segment 14, z-axis conductor 21 and PC board 26 are aligned as shown in FIG. 3. Thereafter, the clamp is urged toward the PC board until the structure assumes the configuration shown in FIG. 4. Finally, the clamp is secured to the PC board, in a manner which is hereinafter described, so that the structure assumes the configuration illustrated in FIG. 6. Clamp 12 urges the leads on TAB segment 14 against that portion of the conductors which extend upwardly from z-axis conductor 21. The conductors which extend downwardly from the z-axis conductor are urged against the outer most portions of leads 28 on PC board 26 thus providing continuous electrical contact between leads 18 on TAB segment 14 and corresponding opposing leads on PC board 26.

For a more detailed description of the preferred embodiment of FIGS. 1-10, attention is first directed to FIGS. 1 and 2. Clamp 12 includes a substantially planar top portion 30. Four posts 32, 34, 36, 38, such being also referred to herein as elongate means, extend downwardly from the lower side of top portion 30. The posts are substantially the same length and are spaced as shown in FIG. 2. Posts 32-38 and top portion 30 comprise molded polycarbonate. Any other relatively hard plastic such as acrylic or vinyl is also suitable.

Figure 6:
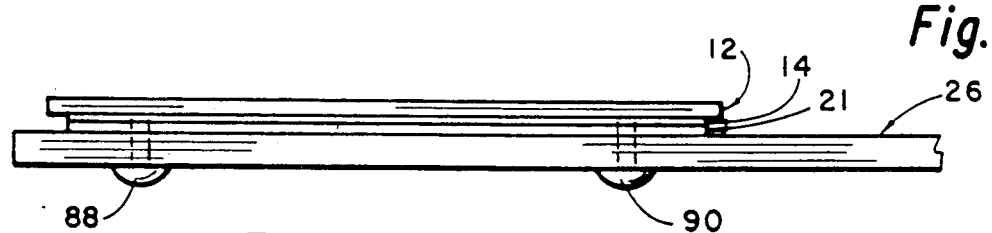
FIG. 6 is a view similar to FIG. 4 after the clamp is heat staked to the PC board.

Four compression members 40, 42, 44, 46 also extend downwardly from the lower side of top portion 30. The compression members each include a downwardly directed surface 48, 50, 52, 54. Clamp 12 is constructed utilizing a conventional two step molding process. Surfaces 48-54 are substantially planar and are referred to herein as a clamping surface or as a resilient portion of clamp 12. As will be seen hereinafter, surfaces 48-54 compress TAB segment 14 and z-axis conductor 21 against PC board 26 thereby maintaining low contact resistance, via conductive elements 24 in z-axis conductor 21, between leads 18 on TAB segment 14 and leads 28 on PC board 26. An opening 56 is centered on top portion 30 and is sized and positioned so that the center thereof is coaxial with the center of die 16 when the clamp is assembled to the PC board as illustrated in FIG. 6. It should be noted the clamp of FIGS. 1 and 3 is slightly different from the clamp of FIGS. 4 and 6 in that the clamp of FIGS. 4 and 6 does not include compression members 40-46. The clamp of FIGS. 1 and 3 is preferred; however, as will later be explained, the clamp of FIGS. 4 and 6 is also usable to practice the present invention.

Attention is again directed to FIG. 3 for additional identification and description of the structure illustrated therein. TAB segment 14 includes four slots, one of which is slot 58, formed through film 20 adjacent each edge of the TAB segment. The conductive leads connected to the side of die 16 facing slot 58 extend on the surface of film 20 from the die to that portion of film 20 between slot 58 and the edge of film 20 adjacent the slot. The leads extending over slot 58 are referred to herein as pads, three of which are pads 60, 61, 63. The pads thus present upwardly directed as well as downwardly directed conductive surfaces. Four holes, one of which is hole 62, are formed through film 20 and are spaced so that posts 32-38 are receivable therethrough. Leads 18 are deposited on film 20 in a pattern which does not overlay any of the four holes, like hole 62. A square opening 64 is defined in the middle of film segment 20. Opening 64 is slightly larger than die 16 and the die is suspended substantially in the middle of the opening by conductive leads 18 which extend from the surface of film 20 to their associated connections with the die.

As previously mentioned, TAB segment 14 is cut along opposing sides 65, 67 from an elongate tape (not shown) upon which a plurality of adjacent TAB segments are formed one after the other. The tape includes sprocket holes, like holes 69, 71, along each side thereof which are engagable with sprocket gears (not shown) for transporting the tape, prior to cutting the tape into individual TAB segments, during various manufacturing and testing cycles. After final testing, the tape, with the TAB segments formed thereon, is wound onto a reel and provided to an assembler for cutting the tape into individual TAB segments and mounting the same on circuit boards.

Sheet 22 likewise includes four holes, one of which is hole 66. Each of the holes, like hole 66, in z-axis conductor 21 are also spaced so that posts 32-38 are receivable therethrough. A square opening 68 is substantially centered on sheet 22. The center of opening 68 is coaxial with the center of opening 64. Opening 68 is slightly larger than opening 64. Although the invention can be implemented without an opening (like opening 68) formed in sheet 22, opening 68 provides an advantage which is described hereinafter.

Figure 7:
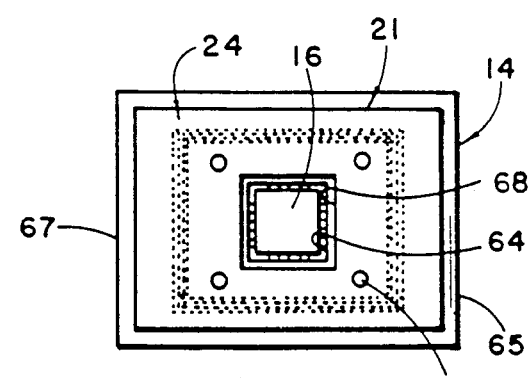
FIG. 7 is a slightly reduced view taken along line 7—7 in FIG. 4.
Figure 8:
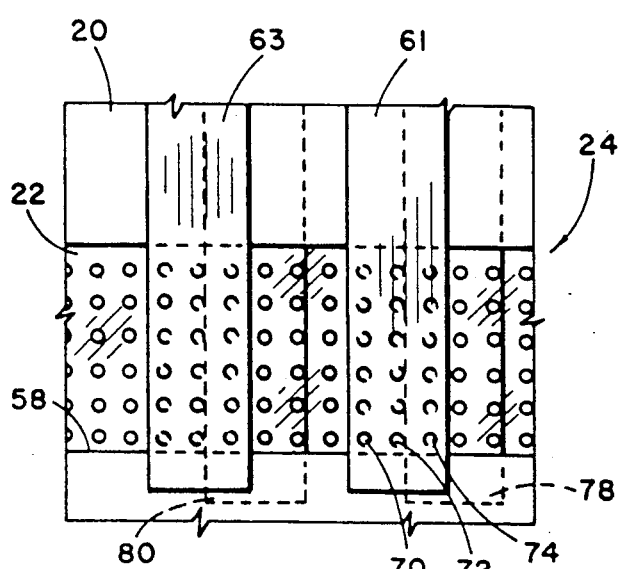
FIG. 8 is a view taken along line 8—8 in FIG. 5.
Figure 9:
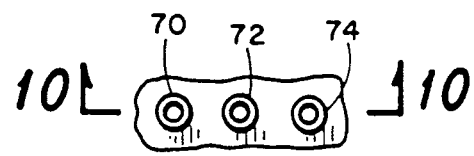
FIG. 9 is an enlarged plan view of a portion of the structure illustrated in FIG. 8.
Figure 10:
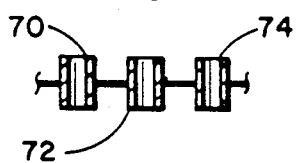
FIG. 10 is a view taken along line 10—10 in FIG. 9.

An enlarged plan view of a portion of conductive elements 24 is shown in FIG. 8. Each of the conductive elements, like elements 70, 72, 74 is substantially tubular in shape. Sheet 22 is formed around the elements so as to form a substantially rectangular track, viewable on one side of sheet 22 in FIG. 3 and on the other side thereof in FIG. 7. The elements, like elements 70-74 are formed in the sheet in a known manner. In the present embodiment of the invention, the elements form a plurality of rows of six each with the rows arranged to form a rectangular pattern adjacent the borders of sheet 22.

Returning again to FIG. 3, leads 28 each terminate in a pad, like pads 76, 78, 80 formed on PC board 26.

In FIGS. 3, 4 and 6, each pad, like pads 76-80 on PC board 26, is beneath a corresponding pad, like pads 60, 61, 63, on TAB segment 14. The opposed corresponding pads are designed to make an electrical connection with one another in accordance with a pre-designed circuit which includes TAB segment 14 as well as other components (not shown) on PC board 26 which are connected to the TAB segment via leads 28 on the PC board. The PC board includes four holes, one of which is hole 81, which are aligned with corresponding holes, like holes 62 and 66 in TAB segment 14 and z-axis conductor 21, respectively.

Consideration will now be given to the operation of the apparatus of the present invention and to the manner in which the method of the present invention is implemented in the embodiment of FIGS. 1-10. One of the conventional steps in the manufacturing process for creating the previously-described tape upon which the TAB segments, like TAB segment 14, are formed includes encapsulating each die. In FIG. 3, with reference to TAB segment 14, commercially available encapsulant is applied to die 16 and to film 20 adjacent opening 64 from the lower side of the film. The encapsulant hardens thus providing a substantially rigid mechanical connection between the die and the film thereby preventing lead breakage. Encapsulant is similarly applied to each of the other TAB segments on the tape (not shown).

With reference to FIG. 7, in one aspect of the invention, individual z-axis conductor sheets, like sheet 21, are positioned on a selected TAB segment, which is one of a plurality of such segments formed on the continuous tape, prior to application of the encapsulant. When encapsulant is applied to die 16 and film 20, it is also applied to film 22 adjacent opening 68. Thus, a single application of encapsulant is used to encapsulate the die as described above and further to bond sheet 21 to film 20 about the perimeter of opening 68. A z-axis conductor sheet, like sheet 21, is applied to each TAB segment on the tape. The encapsulant is pre-cured in a conventional manner, rolled onto a reel and thereafter cured. The reel is thereafter provided to the PC board assembler who cuts the tape into individual tab segments, like tab segment 14 in FIG. 7, each having an associated z-axis conductor, like z-axis conductor 21 bonded thereto.

It should be noted that the alignment tolerances of each z-axis conductor sheet, like sheet 21, with its opposed TAB segment, like TAB segment 14, are not critical. The rectangular pattern formed by conductors 24 on sheet 21 need only be generally opposite the pads, like pads 60, 61, 63, exposed in the TAB segment slots, like slot 58. Alignment is even less critical in the case of a TAB segment having leads formed on the lower side of the film, like film 20, upon which the TAB segment is formed.

In FIG. 5, when TAB segment 14 is mounted on PC board 26, the pads, like pads 60, 61, 63, are generally aligned above corresponding pads, like pads 76, 78, 80, on PC board 26. The pads, like pads 60-63, which are formed in the terminal ends of leads 18, are preferably substantially the same width as the pads, like pads 76-80, formed on PC board 26. In the present embodiment of the invention the pad width, which is viewable in FIG. 5, is approximately 10 mils for both pads on the TAB segment and for those on the PC board. The pitch, i.e., spacing, between the conductive elements, like elements 70-74, in sheet 21 is approximately 3 mils. Thus, as can be seen in FIG. 5, the generally opposing pads, like pad 61 and pad 78, can be misaligned laterally with one another by more than plus or minus 5 mils. Even so, at least some of the conductive elements, like conductive elements 70-74, have an upper surface pressed against the lower surface of pad 61 and a lower surface pressed against the upper surface of pad 78 thereby making electrical connection between the opposing pads. When the TAB segments are mounted on PC boards in an automated assembly line, such alignment tolerances are easily obtainable utilizing optical reflectance equipment thus obviating the need for the more expensive vision equipment which incorporates video cameras and associated signal processing equipment.

After TAB segment 14, having z-axis conductor 21 bonded thereto, is so placed on PC board 26, clamp 12 is positioned by manual or automatic means so that posts 32-38 substantially align with corresponding holes, like hole 62, hole 66, in TAB segment 14 and z-axis conductor 21, respectively, and the corresponding holes in PC board 26. Thereafter clamp 12 is lowered until the posts, like posts 32, 34 in FIG. 4 extend through the holes, like hole 81, in PC board 26 as shown in FIG. 4.

A heat staking iron 82 includes four concave portions formed on an upper surface thereof, two of which are concave portions 84, 86, opposite posts 32-38. Each of the concave portions is opposite a corresponding post. When aligned as in FIG. 4, conventional automated machinery (not shown) lowers the assembly (made up of clamp 12, TAB segment 14, z-axis conductor 21 and PC board 26) and applies pressure to the upper surface of clamp 12 thereby melting the lower ends of posts 32-38 into the concave portions, like portions 84, 86 on iron 82. The iron melts the post ends and shapes the melted plastic into semispherical heads, like heads 88, 90 which secure the assembly together and maintain appropriate pressure for making low resistance contact, via the conductive elements, between opposing pads on the TAB segment and PC board.

In another aspect of the invention, z-axis conductor 21, rather than being first bonded to TAB segment 14, is placed by automated equipment on PC board 26. Thereafter, conventional equipment is utilized to apply adhesive on the lower surface of TAB segment 14 which is then placed on top of sheet 21 in alignment therewith as shown in exploded view in FIG. 3. Next, clamp 12 is placed, also by automated equipment, on the PC board and the automatic heat staking as described above produces the structure illustrated in FIG. 6. It should be appreciated that a person operating conventional assembly assistance tools can perform the same kind of assembly as described above.

When utilizing the clamp embodiment of FIGS. 1 and 3, compression members 40-46 are aligned with a slot, like slot 58, on TAB segment 14 and thus compress all of the TAB segment pads against the corresponding PC board pad when assembled as shown in FIG. 6.

Figure 11:
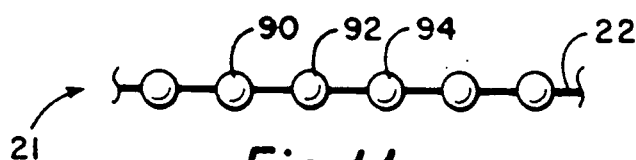
FIG. 11 is a view of a portion of a second embodiment of apparatus constructed in accordance with the present invention which is similar to the view of FIG. 5.

Turning now to FIG. 11, indicated generally therein is a portion of a second embodiment of the invention incorporating a modified z-axis conductor. Identifying numerals previously used herein identify corresponding structure in FIG. 11. As in FIG. 11, z-axis conductor 21 includes sheet 22, but rather than tubular elements, like tubular element 70, 72, 74, in FIG. 5, sheet 22 includes therein a plurality of spherical members 90, 92, 94. Sheet 22 is formed around the spherical members as shown thereby causing each spherical member to present both an upwardly and downwardly directed portion. The spherical members are embedded in sheet 22 to form a pattern, like the pattern of conductive elements 24 in FIG. 7.

When the z-axis conductor of FIG. 11 is used in lieu of the z-axis conductor of FIG. 5, the spherical members provide essentially point contact forces when TAB segment 14 is urged downwardly thereby sandwiching the z-axis conductor between pads 60-63 and pads 76-80 in FIG. 5. The point contact forces provide good electrical contact by "scrubbing" action which results from the point contact made by the spherical members against each opposing pad.

Figure 12:
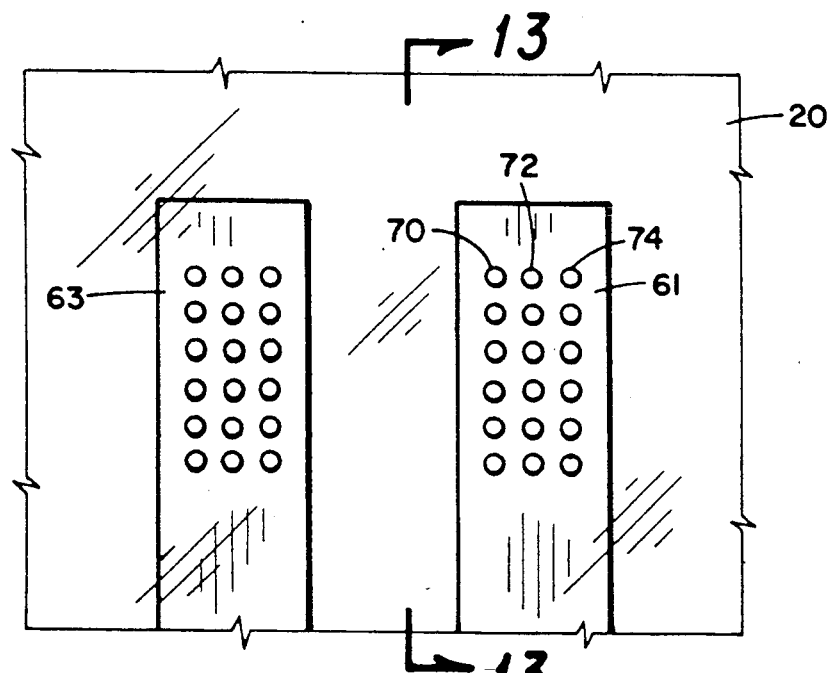
FIG. 12 is an enlarged view of a portion of a third embodiment of apparatus constructed in accordance with the present invention which is similar to the view of FIG. 7.
Figure 13:
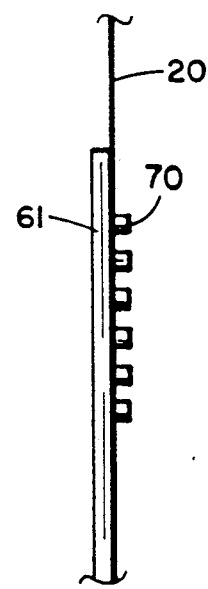
FIG. 13 is a view taken along line 13—13 in FIG. 12.

Turning now to FIGS. 12 and 13, FIG. 12 is an enlarged view of a portion of a third embodiment of apparatus constructed in accordance with the present invention. In the embodiment of FIG. 12, sheet 22, which contained the tubular elements in the embodiment of FIGS. 1-10, is not utilized. The tubular elements, like elements 70, 72, 74 in the embodiment of FIG. 12, are formed in film segment 20 thus eliminating the need for a separate sheet, like sheet 22, disposed between TAB segment 14 and PC board 26. As in the previously-described embodiment, the tubular elements form a rectangular pattern, like conductive elements 24 in FIG. 7. It will be noted that in the embodiment of FIG. 12, there are no tubular elements between adjacent pads, like pads 61, 63. This is because in the embodiment of FIG. 12, the tubular elements are formed integrally with the pad associated therewith. The embodiment of FIG. 12 is formed by a conventional electroplating and etching process which can be readily implemented by a person having ordinary skill in the art.

The embodiment of FIG. 12 is mounted on a PC board in generally the same fashion as shown in FIG. 4. It is, however, to be appreciated, that in side view, z-axis conductor sheet 21 is eliminated since the conductive elements are formed in TAB segment 14.

Figure 14:
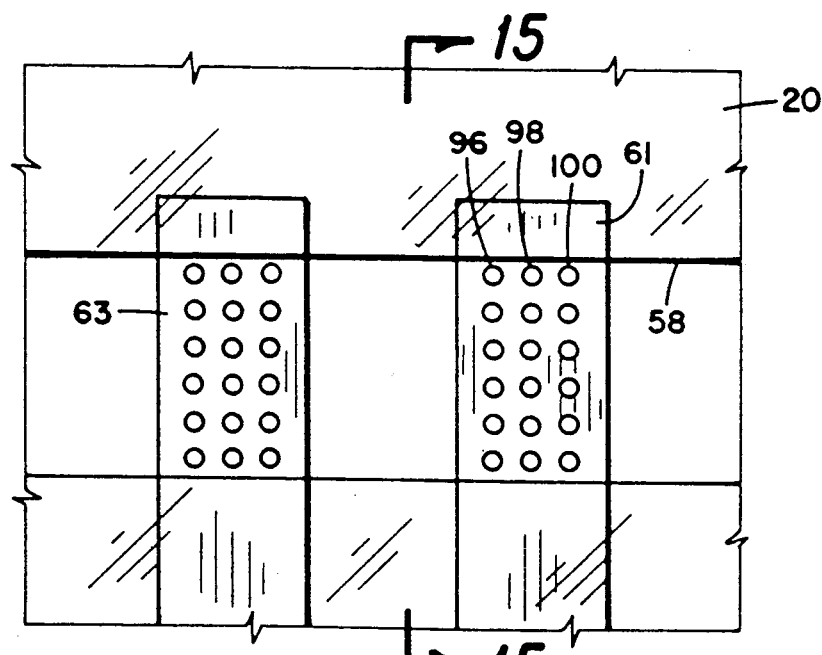
FIG. 14 is an enlarged view of a portion of a fourth embodiment of apparatus constructed in accordance with the present invention which is similar to the view of FIG. 12.

Turning now to the embodiment of FIG. 14, illustrated therein is an enlarged view of a portion of a fourth embodiment of the present invention. As in the embodiment of FIG. 12, the need for a sheet, like sheet 20, is eliminated because the conductive elements, like conductive elements 24 in FIG. 7, are formed on the TAB leads, like leads 61, 63. In FIG. 14, conductive elements 96, 98, 100 are three of a plurality of such elements formed on TAB lead 61. Each of the other TAB leads, including TAB lead 63, includes such conductive elements formed thereon. The conductive elements in the embodiment of FIG. 14 are referred to herein as dimples. The dimples are formed by pressing each TAB lead into a press having a preformed dimpled surface thereon which forms the dimples as shown in FIGS. 14 and 15.

Figure 15:
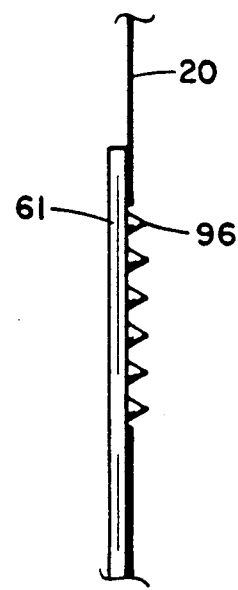
FIG. 15 is a view taken along line 15—15 in FIG. 14.

The embodiment of FIGS. 14 and 15 is mounted on PC board 26 in the same fashion as the embodiment of FIGS. 12 and 13. When the embodiment of FIG. 14 is so mounted, the dimples provide essentially point contact forces which provide scrubbing action, as described in connection with the embodiment of FIG. 11, thereby providing enhanced electrical contact between the TAB leads and the PC board leads.

Having illustrated and described the principles of my invention in a preferred embodiment thereof, it should be readily apparent to those skilled in the art that the invention can be modified in arrangement and detail without departing from such principles. I claim all modifications coming within the spirit and scope of the accompanying claims.

We claim:

1. A method of preparing a plurality of TAB segments for mounting on a printed circuit board, said TAB segments being formed sequentially on an elongated tape and each having a plurality of conductive leads formed thereon, said method comprising the steps of:

for each TAB segment providing a sheet of nonconductive material having a plurality of conductive elements mounted thereon so that each element protrudes from both sides of said sheet; and mounting such a sheet on each TAB segment so that said conductive elements are opposite said TAB segments leads.

2. The method of claim 1 wherein the step of mounting such a sheet on each TAB segment so that said conductive elements are opposite said TAB segment leads comprises the step of bonding such a sheet to each TAB segment.

3. The method of claim 2 wherein said TAB segment includes a die mounted thereon and wherein the step of bonding such a sheet to each TAB segment comprises the steps of:

laying such a sheet on each TAB segment; and depositing encapsulant simultaneously on an edge of said sheet and on said TAB segment.

4. The method of claim 1 wherein the step of mounting said sheet on said TAB segment so that said conductive elements are opposite said TAB segment leads comprises the step of mounting said sheet so that a plurality of conductive elements are opposite each TAB segment lead.

5. A method for creating an electrical connection between a TAB segment of the type having a plurality of conductive leads formed on a film segment and a printed circuit board also having a plurality of conductive leads formed thereon, said method comprising the steps of:
- forming a plurality of dimples on a selected TAB segment lead;
- positioning the TAB segment and the circuit board so that the selected TAB segment lead is opposite a selected circuit board lead; and
- clamping the TAB segment to the circuit board with a clamping surface positioned directly against that portion of the film segment upon which the TAB segment leads are formed thereby urging the dimples on said TAB segment lead against said circuit board lead.

6. The method of claim 5 wherein the step of forming a plurality of dimples on a selected TAB segment lead comprises the step of deforming different portions of the lead in a manner which provides a plurality of point contact forces between the TAB segment lead and the circuit board lead when the dimples on said TAB segment lead are urged against said circuit board lead.

7. A method for creating an electrical connection between a TAB segment of the type having a die and a plurality of conductive leads formed thereon and a printed circuit board also having a plurality of conductive leads formed thereon, said method comprising the steps of:
- providing a sheet of nonconductive material having a plurality of conductive elements mounted thereon so that each element protrudes from both sides of said sheet;
- attaching said sheet to said TAB segment by depositing encapsulant on the sheet and TAB segment;
- positioning said sheet between said TAB segment and said circuit board so that a plurality of conductive elements are disposed between a selected TAB segment lead and a selected printed circuit board lead;
- positioning the TAB segment and the circuit board so that the selected leads are generally opposite one another; and
- urging the TAB segment toward the circuit board thereby compressing the conductive elements between the selected leads.

8. A method for creating an electrical connection between a TAB segment of the type having a die and a plurality of conductive leads formed thereon, on the one hand, and a printed circuit board also having a plurality of conductive leads formed thereon, said method comprising the steps of:
- providing a film of nonconductive material having a plurality of substantially rigid conductive elements mounted thereon so that each element protrudes from both sides of said film;
- positioning said film between said TAB segment and said circuit board so that a plurality of said conductive elements are disposed between each TAB segment lead and a corresponding printed circuit board lead;
- positioning the TAB segment and the circuit board so that each TAB segment lead is generally opposite its corresponding circuit board lead;
- attaching said film to said TAB segment, including depositing encapsulant on the film and the TAB segment; and
- urging the TAB segment toward the circuit board thereby compressing the conductive elements between each TAB segment lead and its corresponding circuit board lead.

9. Apparatus for creating an electrical connection between a TAB segment having a plurality of conductive leads formed thereon and a printed circuit board also having a plurality of conductive leads formed thereon, said apparatus comprising:
- a sheet of nonconductive material having a plurality of conductive elements mounted thereon so that each element protrudes from both sides of said sheet;
- encapsulant for mounting said sheet on said TAB segment; and
- means for compressing the conductive elements between a TAB segment lead and a circuit board lead.

10. The apparatus of claim 9 wherein said conductive elements are disposable between a plurality of selected TAB segment leads and a plurality of circuit board leads.

11. The apparatus of claim 9 wherein said apparatus further includes means for aligning said TAB segment leads with said circuit board leads.

12. The apparatus of claim 11 wherein said aligning means comprises:
- a plurality of holes formed through said TAB segment, said sheet and said circuit board; and
- elongate means for inserting through said holes.

13. The apparatus of claim 9 wherein said conductive elements comprise a plurality of tubular members oriented so that the axes thereof intersect opposing TAB segment and circuit board leads.

14. The apparatus of claim 9 wherein said conductive elements comprises a plurality of substantially spherical members.

15. Apparatus for creating an electrical connection between a TAB segment having a plurality of conductive leads formed thereon and a printed circuit board also having a plurality of conductive leads formed thereon, said apparatus comprising:
- an elongate tape;
- a plurality of said TAB segment formed sequentially on said tape;
- a plurality of sheets formed from nonconductive material, each sheet having a plurality of conductive elements mounted thereon so that each element protrudes from both sides of said sheet;
- means for mounting each sheet on a corresponding TAB segment so that said conductive elements are opposite said TAB segment leads; and
- means for compressing the conductive elements between a TAB segment lead and a circuit board lead.

16. Apparatus for creating a plurality of electrical connections between a plurality of conductive pads formed on a TAB segment having a die mounted thereon and a plurality of conductive pads formed on a printed circuit board, said apparatus comprising:
- a sheet of nonconductive material disposable between said TAB segment and said circuit board, said sheet having an opening therethrough to accommodate said die;
- a plurality of conductive elements mounted on said sheet so that each element protrudes from both sides thereof, said elements defining a conductive pattern in said sheet which substantially corresponds to the pattern formed by said pads.

17. The apparatus of claim 16 wherein said apparatus further includes means for mounting said sheet on said TAB segment.

18. The apparatus of claim 17 wherein said means for mounting said sheet on said TAB segment comprises encapsulant deposited on said sheet and said TAB element at the boundary of said sheet opening.

19. The apparatus of claim 18 wherein said encapsulant is also deposited on said die.

20. The apparatus of claim 16 wherein the conductive elements in said conductive pattern are substantially uniformly distributed.

21. Apparatus for connecting a TAB segment of the type having a plurality of conductive leads formed on a film segment to a printed circuit board also having a plurality of conductive leads, said apparatus comprising:

a plurality of substantially rigid conductive elements disposable between each of said TAB segment leads and an associated circuit board lead for creating an electrical connection therebetween; and a clamp having a resilient nonconducting portion positionable directly over that portion of said film segment upon which said TAB segment leads are formed and urgeable directly thereagainst when said apparatus is in operative condition.

22. The apparatus of claim 21 wherein said apparatus further includes means for aligning said TAB segment leads with said circuit board leads.

23. The apparatus of claim 22 wherein said aligning means comprises:

a plurality of holes formed through said TAB segment and said circuit board; and elongate means mounted on said urging means and being receivable in said holes.

24. The apparatus of claim 21 wherein said TAB segment includes a film of nonconductive material and wherein said conductive elements are mounted thereon.

25. The apparatus of claim 21 wherein said conductive elements comprises a plurality of dimples formed on said TAB segment leads.

* * * * *